United States Patent [19]

Wilson

[11] 3,877,122

[45] Apr. 15, 1975

[54] METHOD OF FABRICATING THIN QUARTZ CRYSTAL OSCILLATOR BLANKS

[75] Inventor: Richard W. Wilson, Phoenix, Ariz.

[73] Assignee: Motorola, Inc., Chicago, Ill.

[22] Filed: Sept. 26, 1973

[21] Appl. No.: 400,998

[52] U.S. Cl. ............... 29/25.35; 51/281 SF; 51/323

[51] Int. Cl. ............................................ B01j 17/00

[58] Field of Search ............ 29/25.35, 424; 51/283, 51/216 LP, 216 R, 281 SF, 323; 310/9.5

[56] References Cited

UNITED STATES PATENTS

| | | | |
|---|---|---|---|
| 3,123,953 | 3/1964 | Merkl | 51/283 |
| 3,325,319 | 6/1967 | Frantzen | 29/424 X |
| 3,803,774 | 4/1974 | Miller | 51/283 |

*Primary Examiner*—Carl E. Hall
*Attorney, Agent, or Firm*—Vincent J. Rauner; Willis E. Higgins

[57] ABSTRACT

A method is provided for forming thin quartz crystals usable as a source of piezoelectric oscillation. A method is provided for fabricating quartz crystals to a thickness of one-half mil. Using state-of-the-art techniques the quartz crystal blank is thinned to the range of 5 to 10 mils. The sides of these quartz plates are lapped plane and parallel to the correct crystallographic orientation by conventional and well-known technology. Upon one side of this quartz plate would be deposited a layer of material some 10 to 15 mils thick. This material would be preferably one that matches the linear coefficient of expansion of the quartz as close as possible. Suitable materials include molybdenum, tungsten, Kovar, Therlo, Allegheny number 42, or polycrystalline silicon. The method of deposition of this backing material is important. The temperature of the quartz plate must be kept significantly below the curie point and preferably no higher than 250°C.

8 Claims, 4 Drawing Figures

LAPPING QUARTZ TO THIN PLATE

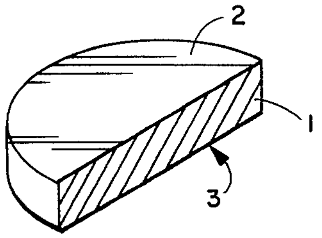
Fig. 1A
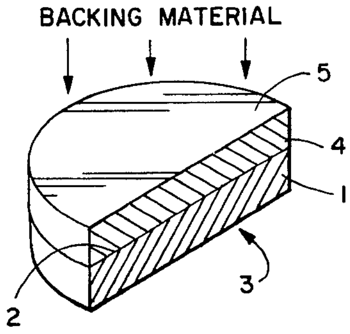
Fig. 1B
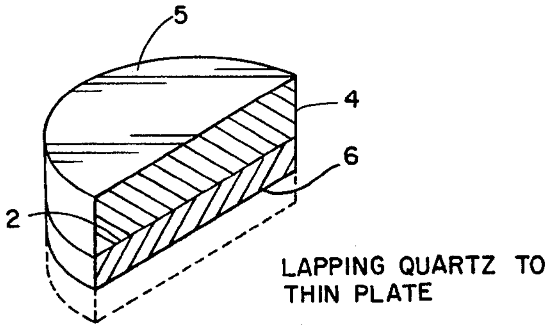
Fig. 1C
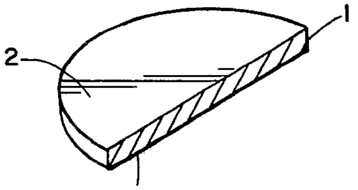

METHOD OF FABRICATING THIN QUARTZ CRYSTAL OSCILLATOR BLANKS

BACKGROUND OF THE INVENTION

Quartz crystals vibrating in their thickness sheer modes are in wide use for the control of high frequencies. Since the frequency response of the crystal is inversely proportional to the thickness, the crystal becomes extremely thin at the higher end of the frequency range. This practical thickness for a working single crystal quartz blanks for oscillators using state-of-the-art techniques is about 2½ to 3 mils. Such thicknesses result in maximum fundamental frequencies of some 20 megahertz. This limitation on thickness limits the operation at higher frequencies. This limitation of lower frequency is not desirable for the following reason. At higher frequencies one must use harmonics of the fundamental. These harmonics have a lower activity or piezoelectric effect than the fundamental. Thus, a system operating in harmonic mode is less efficient and more subject to drift and mode hopping. As filters the harmonics because of this lower activity do not reject adjacent signals as well as a unit operating in fundamental mode.

SUMMARY OF THE INVENTION

The present invention relates to piezoelectric crystal units and more particularly to a method of making very thin crystal plates with major surfaces parallel to each other.

It is an object of the present invention to provide a method for making thin crystal plates having major surfaces parallel to each other.

It is another object of the present invention to provide a method for making crystal plates having major surfaces parallel with each other by first using standard techniques to reduce the size of the crystal plate to a range of 5 to 10 mils, next depositing a layer of material which matches the linear coefficient of expansion of the quartz plate as closely as possible, and depositing this backing material on the plate at a temperature below the curie point of the quartz blank.

It is a still further object of the present invention to use a backing material which matches the coefficient of expansion of the quartz plate including such materials as molybdenum, tungsten, Kovar, Therlo, Allegheny No. 42 and poly silicon.

It is another object of the present invention to use a backing material which is removable by differential chemical etching.

A still further object of the present invention is to deposit the backing material on the quartz blank at a rate above a certain minimum for providing a film of good bulk density and adhesion to the quartz blank.

A still further object of the present invention is to form the backing material on the quartz blank in a precise manner to insure the required degree of parallelism of the two final quartz surfaces by means of an arc plasma spraying or ion plating.

DESCRIPTION OF THE FIGURES

FIGS. 1A to 1D show the various steps involved in the process of the present invention.

BRIEF DESCRIPTION OF THE INVENTION

The present invention is directed to a method for making very thin quartz crystal plates having major surfaces parallel each to the other. Since the frequency of oscillation of the quartz crystal plate is a function of its physical dimension, primarily its thickness, it is desirable to fabricate these quartz crystal plates as thin as possible in order to obtain as high an operating frequency as possible. Using state-of-the-art techniques, it is possible to obtain crystal plates having a thickness within the range of 2-½ to 3 mils. However, there is a need to provide crystal plates having a maximum thickness of one-half mil for high frequency operation.

Referring to FIG. 1A there is shown a quartz crystal plate which forms the starting material of the present method. The thickness of this quartz crystal plate 1 can be any convenient thickness. Using standard state-of-the-art lapping techniques, the quartz crystal plate is reduced in thickness the same as if a standard moderate frequency crystal is being fabricated and to a thickness of 4 to 6 mils. It should be borne in mind that all thicknesses shown in FIGS. 1A thru 1D are relative and have been exaggerated to illustrate the various steps of the process.

As shown in FIG. 1B, the quartz plate has major surfaces 2 and 3 parallel to each other as formed by well-known lapping techniques.

As shown in FIG. 1B, a backing material 4 is formed on the quartz plate 1 forming upper surface 5 which is parallel with 2 of the quartz. One requisite for the backing material is that it has a similar coefficient of expansion to the quartz plate 1. Such materials suitable for this purpose include molybdenum, tungsten, Kovar, Therlo, Allegheny No. 42 or poly silicon material. It is desirable that the backing material have the same coefficient for expansion as the quartz plate such that in any heating or cooling of the combination, there is less chance that the quartz plate would break or warp due to its adhesion to the much thicker backing material.

An additional limitation in the method of adding the backing material to the quartz plate is the temperature at which the backing material is added to the quartz plate. The temperature of the quartz plate should be kept below the curie point and preferably no higher than 250°C for the following reasons. The slight mismatch that occurs between the quartz blank and the backing material will cause a bowing of the composite structure such as occurs in any bimetallic element. Keeping the temperature below 250°C would minimize this effect so that the final thinned quartz blank would have the necessary precision of parallel surface on the largest possible area.

An additional limitation in the present process is that the backing material should be applied to the quartz blank at a high enough deposition rate to provide a film of sufficient density. The layer of backing material should make a good bond to the quartz blank.

In order to achieve sufficiently high deposition rates which provide backing material films of good adhesion to the crystal plate, it has been found that the arc plasma spraying of the backing material would provide a sufficiently good method.

Another requirement is that the backing material be deposited uniformly and parallel to the quartz surface within tolerances better than one micrometer. Ion plating is attractive as the means for forming the backing material on the quartz because it is a uniform vacuum deposition method and because planetary substrate holders can be employed to achieve a uniform backing layer within the desired tolerance simultaneously on a large number of substrates.

In brief, each of these techniques would be practiced as follows:

Arc plasma spraying is conducted at atmospheric pressures, usually in air although vaccum or inert gas chambers can be used, by atomizing material in a plasma arc. The velocity of the gas stream within the arc carries the vaporized material out of the gun or atomizing chamber and it subsequently condenses on the surface of the substrates, in this case the quartz crystal oscillator blanks. A suitable holder is used to keep the thin quartz blanks from blowing away due to the force of the arc plasma stream and to prevent deposition on the backside of the quartz blanks. Such holders are easily fabricated from material such as stainless steel. A rotational motion needs to be applied to the substrate holder as the plasma arc is swept to assure the proper uniformity of the coating.

Ion plating is a vacuum deposition technique that is essentially a discharge assisted evaporation, as such the method affords extremely good adhesion of the vaporized material to the substrate and also a high rate of deposition. The equipment is similar to that used for conventional electron beam evaporation. Consequently, the conventional substrate holders that are used would also afford excellent thickness uniformity on the quartz blanks. Of the two methods ion plating is preferred because of this uniformity, non-porosity of the deposit, and adhesion. Arc plasma spraying has an advantage in higher deposition rates and the lower initial cost of the deposition equipment itself.

Referring to FIG. 1C there can be shown how the quartz plate 1 has been further thinned using the backing material 4 as a handle. The composite combination of backing material and quartz plate is placed in the standard lapping machine to reduce the quartz plate to its desired thickness exposing new surface 6. It has been found that the quartz plate can be reduced to at least one-half mil. Each of the methods described for forming the backing material on the quartz plate have proved adequate in the thinning of the quartz plate.

An additional limitation on the method of the present invention is that the backing material be removable by chemical etching. Chemical etches are well-known which will remove the metallic backing materials from the quartz plates resulting in the very thin piezoelectric quartz plate as shown in FIG. 1D. This quartz plate can now be further divided in area to several small oscillator plates, each of which would be subsequently metallized for electrodes and mounted in a conventional manner. If polycrystalline silicon is used as the backing material, such polycrystalline silicon can be etched at a ratio as high as 100:1 in relation to the quartz itself being etched. This means that very little compensation for additional quartz thinning would be required if polycrystalline silicon is used as the backing material. Generally, a slight chemical etching of the quartz is required to remove surface damage so a small surface etching of the quartz would be beneficial.

In practice molybdenum has been identified as the material for use in the best embodiment.

While the invention as has been particularly shown and described with reference to a preferred embodiment thereof, it will be understood by those skilled in the art that the foregoing and other changes in form and details may be made therein without departing from the spirit and scope of the invention.

What is claimed is:

1. A method of making a piezoelectric crystal unit from a plate of crystalline material having a pair of opposing faces of which both are smooth and flat, comprising the steps of:

depositing a backing material on the crystalline plate at a temperature below the curie point of the crystalline plate;

thinning the crystalline plate to a desired thickness; and removing the backing material through chemical etching.

2. The method of claim 1 wherein the backing material is selected from the group comprising molybdenum, tungsten, Kovar, Therlo, Allegheny No. 42 or polycrystalline silicon.

3. The method of claim 1 wherein said step of depositing is by ion plating.

4. The method of claim 1 wherein said step of depositing is by plasma arc spraying.

5. The method of claim 1 in which the crystalline material is quartz.

6. The method of claim 1 in which the backing material is deposited at a temperature no higher than 250°C.

7. A method of making a piezoelectric crystal unit from a plate of crystalline material having a pair of opposing faces both of which are smooth and flat, comprising the steps of:

forming an adherent molybdenum layer atop one surface of the crystalline plate at a temperature no higher than 250°C, and with its outward facing surface precisely parallel and uniform to the initial crystalline surface;

thinning the crystalline plate to a desired thickness; and removing by chemical etching the layer of molybdenum material from the crystalline plate.

8. The method of claim 7 in which the crystalline material is quartz.

* * * * *